(12) United States Patent
Otremba et al.

(10) Patent No.: US 9,041,170 B2
(45) Date of Patent: May 26, 2015

(54) MULTI-LEVEL SEMICONDUCTOR PACKAGE

(71) Applicant: Infineon Technologies Austria AG, Villach (AT)

(72) Inventors: Ralf Otremba, Kaufbeuren (DE); Josef Höglauer, Heimstetten (DE); Klaus Schiess, Allensbach (DE); Chooi Mei Chong, Melaka (MY)

(73) Assignee: Infineon Technologies Austria AG, Villach (AT)

( * ) Notice: Subject to any disclaimer, the term of this patent is extended or adjusted under 35 U.S.C. 154(b) by 27 days.

(21) Appl. No.: 13/855,015

(22) Filed: Apr. 2, 2013

(65) Prior Publication Data

US 2014/0291849 A1  Oct. 2, 2014

(51) Int. Cl.
*H01L 23/495* (2006.01)
*H01L 23/051* (2006.01)
(Continued)

(52) U.S. Cl.
CPC ......... *H01L 23/49524* (2013.01); *H01L 23/051* (2013.01); *H01L 23/3107* (2013.01); *H01L 2224/32245* (2013.01); *H01L 2224/48091* (2013.01); *H01L 2224/48247* (2013.01); *H01L 2224/48465* (2013.01); *H01L 2224/73265* (2013.01); *H01L 23/49562* (2013.01); *H01L 23/49575* (2013.01); *H01L 24/48* (2013.01); *H01L 2924/00014* (2013.01); *H01L 2924/13091* (2013.01); *H01L 2224/73221* (2013.01); *H01L 2224/73263* (2013.01); *H01L 2224/40245* (2013.01); *H01L 24/33* (2013.01); *H01L 24/40* (2013.01); *H01L 24/41* (2013.01); *H01L 2924/13062* (2013.01); *H01L 2924/1306* (2013.01); *H01L 2924/13055* (2013.01)

(58) Field of Classification Search
USPC .......................................... 257/666, E23.043
See application file for complete search history.

(56) References Cited

U.S. PATENT DOCUMENTS

| 6,255,722 B1 | 7/2001 | Ewer et al. |
| 6,677,669 B2 | 1/2004 | Standing |
| 6,946,740 B2 | 9/2005 | Schaffer |

(Continued)

FOREIGN PATENT DOCUMENTS

| DE | 10301091 A1 | 7/2004 |
| DE | 102008027703 A1 | 1/2009 |
| DE | 102008051965 A1 | 7/2009 |

OTHER PUBLICATIONS

Author Unknown. "Complete Current Share 10A DC/DC Power Module." FN8271.4. Intersil Americas LLC. Mar. 7, 2013. pp. 1-24.

(Continued)

*Primary Examiner* — Daniel Whalen
(74) *Attorney, Agent, or Firm* — Murphy, Bilak & Homiller, PLLC

(57) ABSTRACT

A semiconductor package includes a semiconductor die having a first electrode at a first side and a second electrode at a second side opposing the first side, a first lead under the semiconductor die and connected to the first electrode at a first level of the package, and a second lead having a height greater than the first lead and terminating at a second level in the package above the first level, the second level corresponding to a height of the semiconductor die. A connector of a single continuous planar construction over the semiconductor die and the second lead is connected to both the second electrode and the second lead at the same second level of the package.

6 Claims, 4 Drawing Sheets

(51) Int. Cl.
  *H01L 23/31*  (2006.01)
  *H01L 23/00*  (2006.01)

(56) References Cited

U.S. PATENT DOCUMENTS

| | | | |
|---|---|---|---|
| 7,208,818 | B2 | 4/2007 | Luo et al. |
| 7,285,849 | B2 | 10/2007 | Cruz et al. |
| 7,800,208 | B2 | 9/2010 | Otremba |
| 7,804,131 | B2 | 9/2010 | Cheah et al. |
| 7,851,908 | B2 | 12/2010 | Otremba et al. |
| 7,944,044 | B2 | 5/2011 | Carney et al. |
| 8,193,618 | B2 | 6/2012 | Madrid |
| 2008/0023825 | A1 | 1/2008 | Hebert et al. |
| 2008/0224323 | A1 | 9/2008 | Otremba |
| 2010/0148327 | A1* | 6/2010 | Madrid .................. 257/670 |
| 2012/0292753 | A1 | 11/2012 | Cho |
| 2012/0299119 | A1 | 11/2012 | Xue et al. |

OTHER PUBLICATIONS

Author Unknown. "60A Integrated PowIRstage." IR3550, Final Datasheet. International Rectifier. Mar. 12, 2012. pp. 1-22.

Author Unknown. "High Performance DrMOS." TDA21220, Data Sheet Revision 1.9. Infineon Technologies AG. Mar. 31, 2012. pp. 1-26.

\* cited by examiner

MULTI-LEVEL SEMICONDUCTOR PACKAGE

TECHNICAL FIELD

The instant application relates to semiconductor packages, and more particularly to multi-level semiconductor packages.

BACKGROUND

Increases in integration density of electronic components and associated greater demand on thermal and electrical conductivities of the package require new connection technologies with better thermal and electrical conductivity, and also require new construction technology for the corresponding connecting elements. In recent years, metal clips have gained in popularity over wire bonds for providing electrical connections between semiconductor die (chip) electrodes and the leads of a molded package. Metal clips provide a large-area connection between the package leads and die electrodes, permitting an increase in the electrical and thermal properties of the package as compared to wire bonds. Conventional molded packages, however, provide all leads at the same level in the package, limiting electrical and thermal performance and interconnect placement within the package.

SUMMARY

Embodiments described herein provide a semiconductor package with leads that terminate at different levels in the package. At least one connector of a single continuous planar construction is included in the package for connecting an electrode of a semiconductor die to a package lead at the same level in the package.

According to an embodiment of a semiconductor package, the package comprises a semiconductor die having a first electrode at a first side and a second electrode at a second side opposing the first side, a first lead under the semiconductor die and connected to the first electrode at a first level of the package, and a second lead having a height greater than the first lead and terminating at a second level in the package above the first level, the second level corresponding to a height of the semiconductor die. A connector of a single continuous planar construction over the semiconductor die and the second lead is connected to both the second electrode and the second lead at the same second level of the package.

According to an embodiment of a method of manufacturing a semiconductor package, the method comprises: providing a semiconductor die having a first electrode at a first side and a second electrode at a second side opposing the first side; connecting a first lead under the semiconductor die to the first electrode at a first level of the package; providing a second lead having a height greater than the first lead and terminating at a second level in the package above the first level, the second level corresponding to a height of the semiconductor die; and connecting a connector of a single continuous planar construction disposed over the semiconductor die and the second lead to both the second electrode and the second lead at the same second level.

According to another embodiment of a semiconductor package, the package comprises a first semiconductor die having a top side and a bottom side and a second semiconductor die over the first die and having a top side facing away from the first die and a bottom side facing the top side of the first die. An electrode at the top side of the first die is connected to an electrode at the bottom side of the second die between the first and second dies. A first lead under the first die is connected to an electrode at the bottom side of the first die at a first level of the package. A second lead having a height greater than the first lead terminates at a second level in the package above the first level, the second level corresponding to a height of the second die. A connector of a single continuous planar construction over the second die and the second lead is connected to both an electrode at the top side of the second die and the second lead at the same second level of the package.

According to another embodiment of a method of manufacturing a semiconductor package, the method comprises: connecting an electrode at a bottom side of a first semiconductor die to a first lead under the first die at a first level of the package; connecting an electrode at a top side of the first die to an electrode at a bottom side of a second semiconductor die disposed over the first die; and connecting an electrode at a top side of the second die to a second lead at a same second level of the package above the first level via a connector of a single continuous planar construction disposed over the second die and the second lead, the second lead having a height greater than the first lead and terminating at the second level, the second level corresponding to a height of the second die.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings.

DETAILED DESCRIPTION

The embodiments described herein provide a semiconductor package with leads that terminate at different levels in the package. At least one connector is included in the package for connecting one or more semiconductor die electrodes to a lead which terminates at the same level in the package as the connector. Accordingly, the connector can have a single continuous planar construction, and the lead extends to the planar connector instead of the connector having to be bent downward toward the same base level of the package where all leads of a package conventionally terminate. More than one connector having a single continuous planar construction can be provided, so that multiple die electrodes can be connected to different leads of the package at multiple levels in the package each in a generally planar arrangement. Providing the leads at different levels in a semiconductor package and using connectors of a single continuous planar construction for die electrode-to-lead connections improves the electrical and thermal performance of the package and increases design flexibility.

Figure 1:
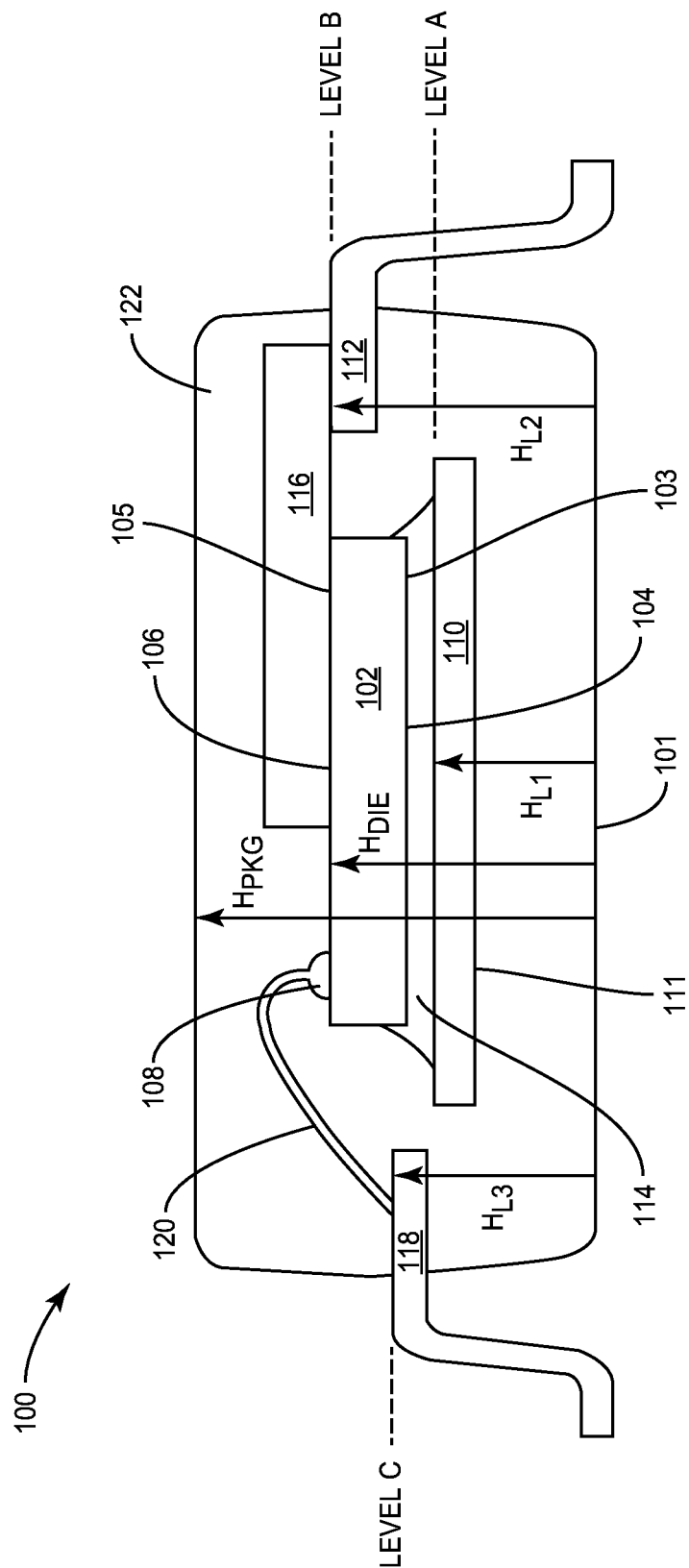
FIG. 1 illustrates a cross-sectional view of a multi-level semiconductor package according to an embodiment.

FIG. 1 illustrates a cross-sectional view of an embodiment of a multi-level semiconductor package 100 having a height $H_{PKG}$. The package 100 includes at least one semiconductor die 102 having a height $H_{DIE}$ in the package 100. The die 102 has a first electrode 104 at a first side 103 (bottom side in FIG. 1) of the die 102 and a second electrode 106 at a second side 105 (top side in FIG. 1) of the die 102 opposing the first side 103. Any type of semiconductor die 102 can be used in the package 100. The type of die 102 depends on the application for which the package 100 is designed, and can include, e.g., an IGBT (insulated gate bipolar transistor), MOSFET (metal oxide semiconductor field effect transistor), JFET (junction field effect transistor), diode, etc. In the case of a transistor die 102, a third electrode 108 can be provided at the second (top) side 105 of the die 102. In this case, the electrode 104 at the first (bottom) side 103 of the die 102 can be a drain electrode of a MOSFET or a collector electrode of an IGBT, and the electrodes 106, 108 at the second (top) side 105 can be a source electrode of a MOSFET or an emitter electrode for an IGBT and a gate (control) electrode, respectively. The gate (control) electrode 108 is omitted for a diode. More than one die can be included in the package 100. For example, separate high-side and low-side transistor dies can be included in the package 100 together with a gate driver die for controlling the high-side and low-side transistors. Alternatively, the high-side and low-side transistor dies can be included in separate ones of the multi-level packages described herein as discrete components.

In each case, the multi-level package 100 further includes a first lead 110 under the semiconductor die 102. The first lead 110 is connected to the first electrode 104 of the die 102 at a first level ('level A') of the package 100. Contact can be made to the bottom side 111 of the first lead 110 through a conductive plug or other electrically conductive structure extending from the backside 101 of the package 100 to the first lead 108. Such a structure improves the thermal performance of the package 100, and is not shown in FIG. 1 for ease of illustration.

A second lead 112 having a height ($H_{L2}$) greater than a height ($H_{L1}$) of the first lead 110 terminates at a second level ('level B') in the package 100 above the first level. The second level corresponds to the height ($H_{DIE}$) of the die 102. The first electrode 104 of the die 102 is attached to the first lead 110 via a joining layer 114, such as an electrically conductive solder, adhesive or tape, and the second level accounts for the combined thickness of the die 102 and the joining layer 114. This way the second lead 112 terminates approximately in the same plane as the second electrode 106 at the second (top) side 105 of the die 102, allowing for a generally planar connection between the second electrode 106 and the second lead 112.

To this end, a connector 116 of a single continuous planar construction is disposed over the semiconductor die 102 and the second lead 112. The connector 116 is connected to both the second lead 112 and the second electrode 106 at the second (top) side 105 of the die 102 at the same second level (Level B) in the package 100, providing a large-area planar connection between the second electrode 106 of the die 102 and the second lead 112.

If the semiconductor die 102 is a transistor die, the package 100 further includes a third lead 118 having a height ($H_{L3}$) less than the second lead 112 for connecting to the second (gate/control) electrode 108 at the second (top) side 105 of the die 102. The third lead 118 terminates at a third level ('level C') in the package 100 between the first and second levels. A bond wire 120 connects the third lead 118 to the third electrode 108 at the second (top) side 105 of the die 102. The semiconductor die 102, at least part of the connector 116, and part of the leads 110, 112, 118 are encapsulated by a mold compound 122, such as an epoxy resin, so that a section of each lead 110, 112, 118 and, optionally, part of the connector 116 remain uncovered by the mold compound 122.

Figure 2:
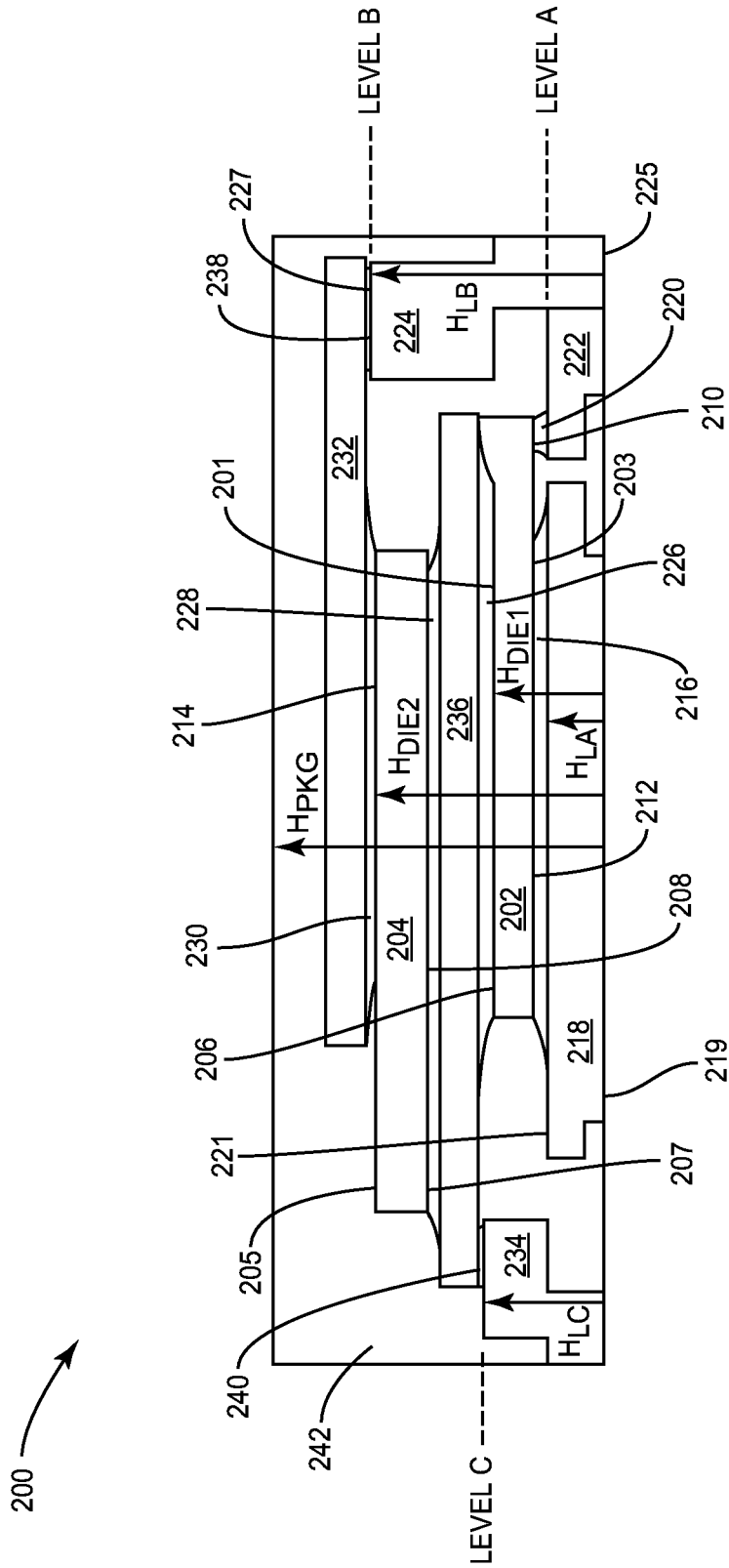
FIG. 2 illustrates a cross-sectional view of a multi-level semiconductor package according to another embodiment.

FIG. 2 illustrates a cross-sectional view of another embodiment of a multi-level semiconductor package 200 having a height $H_{PKG}$. The package 200 includes a first (lower) semiconductor die 202 having a height $H_{DIE1}$ in the package 200 and a second (upper) semiconductor die 204 over the first die 202 and having a height $H_{DIE2}$ in the package 200, where $H_{DIE1} < H_{DIE2} < H_{PKG}$. The first die 202 has a top side 201 and a bottom side 203, and the second die 204 has a top side 205 facing away from the first die 202 and a bottom side 207 facing the top side 201 of the first die 202.

Figure 3:
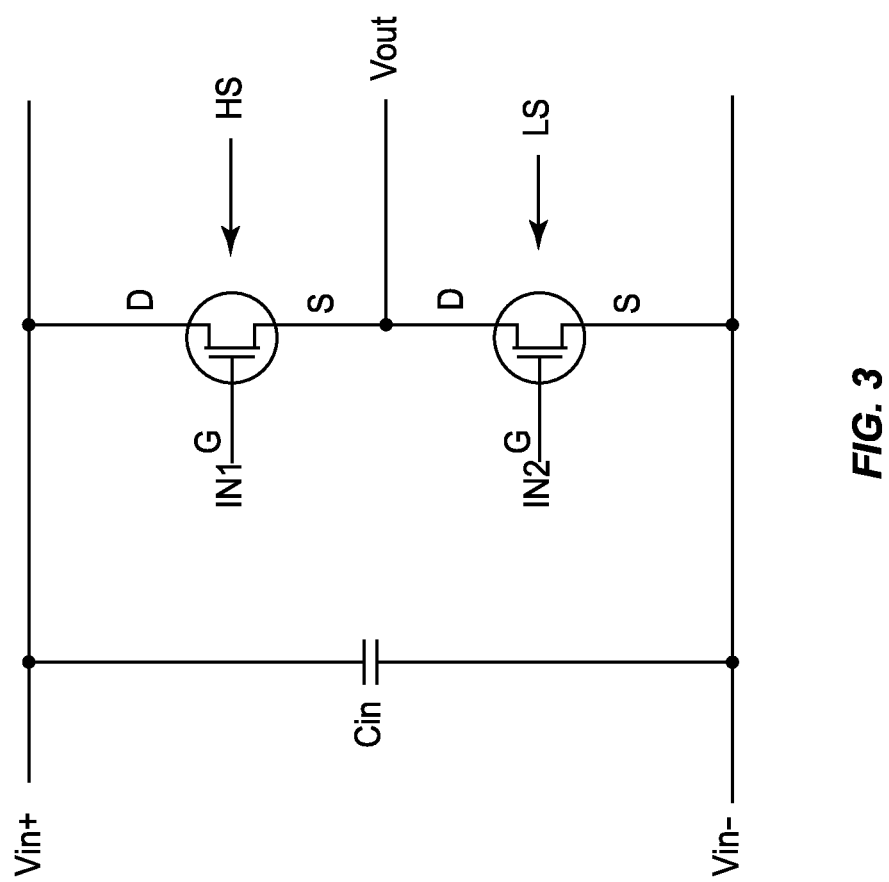
FIG. 3 illustrates an exemplary circuit diagram of a half-bridge converter circuit realized by the components included in the package of FIG. 2.

An electrode 206 at the top side 201 of the first die 202 is connected to an electrode 208 at the bottom side 207 of the second die 204 between the first and second dies 202, 204 so that these electrodes 206, 208 are at the same electric potential. In a purely exemplary embodiment, the circuit realized by the dies 202, 204 included in the package 200 of FIG. 2 is a half-bridge converter circuit, as shown in FIG. 3. The half-bridge circuit includes a low-side transistor (LS), a high-side transistor (HS) and an input capacitor (Cin) coupled between the positive input (Vin+) and the negative input (Vin−) of the half-bride circuit. The negative input can be grounded in some configurations. The low-side transistor LS corresponds to the first die 202 shown in FIG. 2, the high-side transistor HS corresponds to the second die 204, and the input capacitor Cin is out of view in FIG. 2. In the exemplary circuit diagram shown in FIG. 3, the transistors are MOSFETs, each having gate (G), drain (D) and source (S) terminals.

The gate, drain and source terminals of the low-side transistor LS correspond to gate, source and drain electrodes of the first die 202 shown in FIG. 2. The gate, drain and source terminals of the high-side transistor HS likewise correspond to gate, source and drain electrodes of the second die 204. The drain terminal of the high-side transistor HS is electrically connected to the positive input (Vin+) of the half-bridge circuit. The source terminal of the high-side transistor HS is electrically connected to the drain terminal of the low-side transistor LS to form the output (Vout) of the half-bridge circuit. The source terminal of the low-side transistor LS is electrically connected to the negative input (Vin−). The transistor gates serve as control signal inputs (IN1, IN2). IGBTs could be used instead of MOSFETs where the collector connections of the IGBTs would correspond to the drain connections of the MOSFETs, and the emitter connections of the IGBTs would correspond to the source connections of the MOSFETs. In either case, the positive input terminal (Vin+), the negative input terminal (Vin−), and the output terminal (Vout) of the half-bridge circuit correspond to different leads of the package 200 shown in FIG. 2. In general the type and number of semiconductor dies included in the package 200 depends on the particular application for which the package 200 is designed, and the die electrode-to-lead interconnect embodiments described herein can be used in each case.

Each semiconductor die 202, 204 included in the package 200 has one or more electrodes on each side of the die, as explained above. For example, the first die 202 has a gate electrode 210 and a source electrode 212 on the bottom side 203 of the die 202, and a drain electrode 206 on the top side 201 of the die 202. In an opposite manner, the second die 204 has a drain electrode 208 on the bottom side 207 of the die 204, and a gate electrode and a source electrode 214 on the top side 205 of the die 204. The gate electrode of the second die 204 is out of view in FIG. 2. The first die 202 has a so-called 'flip-chip' configuration according to this embodiment. However, other die configurations can be used.

The source/emitter electrode 212 of the first die 204 is connected by a first joining layer 216, such as an electrically conductive solder, adhesive, or tape, to a first lead 218 of the package 200. The first lead 218 is disposed under the first die 204, has a height $H_{LA}$, and is electrically connected to the negative input (Vin−) of the half-bridge circuit. The first lead 218 has an uncovered first side 219 facing away from the dies 202, 204 and an opposing second side 221 connected to the source/emitter electrode 212 at the bottom side 203 of the first die 202 via the first joining layer 216 at a first level ('level A') of the package 200. The gate electrode 210 of the first die 204 is connected by a second joining layer 220, such as an electrically conductive solder, adhesive, or tape, to a second lead 222 of the package 200 at the same level (Level A) as the source/emitter electrode 212 of the first die 202. The second lead 222 is electrically connected to the gate input (IN2) of the low-side transistor LS.

The package 200 further includes a third lead 224 having a height $H_{LB} > H_{LA}$ and terminating at a second level ('level B') in the package 200 above the first level. The third lead 224 has an uncovered first side 225 facing away from the dies 202, 204 and an opposing second side 227 which terminates at the second level. The second level corresponds to a height of the second die 204, and accounts for the combined thickness of the dies 202, 204 and any intermediary joining layers 216, 226, 228. The third lead 224 is electrically connected to the positive input terminal (Vin+) of the half-bridge circuit.

The drain/collector electrode 214 of the second die 204 is connected by a joining layer 230, such as an electrically conductive solder, adhesive, or tape, to a first (upper) connector 232 of a single, continuous planar construction disposed over the second die 204 and the third lead 224. The first planar connector 232 is connected to both the drain/collector electrode 214 at the top side 205 of the second die 204 and the third lead 224 at the same second level (Level B), providing a large-area planar connection between the drain/collector electrode 214 of the second die 204 and the third lead 224 of the package 200.

The package 200 also includes a fourth lead 234 having a height $H_{LC}$ where $H_{LB} > H_{LC} > H_{LA}$, and terminating at a third level ('level C') in the package 200 between the first and second levels. The third level of the package 200 corresponds to a height of the first die 202, and accounts for the combined thickness of the first die 202 and the joining layer 216 at the bottom side 203 of the first die 202.

A second connector 236 of a single continuous planar construction extends between the first and second dies 202, 204 to the fourth lead 234, and connects the drain/collector electrode 206 at the top side 201 of the first die 202 and the source/emitter electrode 208 at the bottom side 207 of the second die 204 to the fourth lead 234. The second planar connector 236 is connected to both the drain/collector electrode 206 at the top side 201 of the first die 202 and the fourth lead 234 at the same third level (Level C). The planar connectors 232, 236 can be connected to the corresponding leads by additional joining layers 226, 228, 230, 238, 240, such as an electrically conductive solder, adhesive, or tape, respectively. The semiconductor dies 202, 204, joining layers 216, 226, 228, 230, 238, 240, at least part of the planar connectors 232, 236, and part of the leads 218, 222, 224, 234 are encapsulated by a mold compound 242, such as an epoxy resin, so that a section of each lead 218, 222, 224, 234 and, optionally, part of one or both connectors 232, 236 remain uncovered by the mold compound 242.

Figure 4:
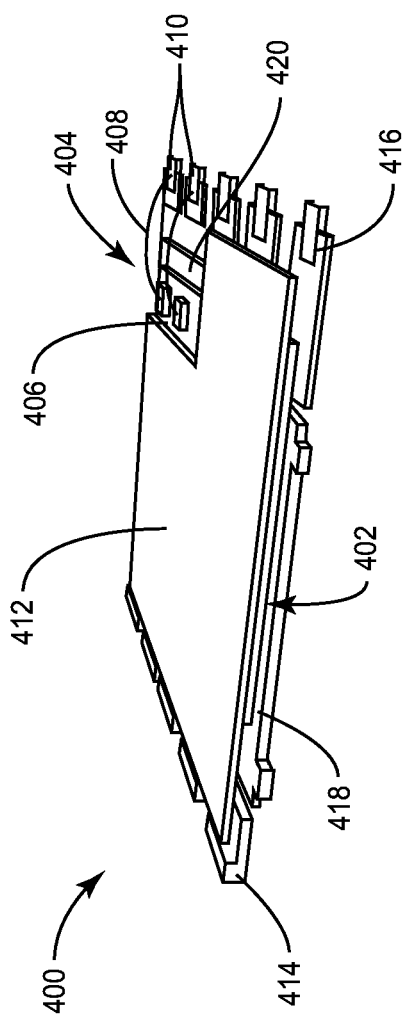
FIG. 4 illustrates a top plan view of a multi-level semiconductor package according to yet another embodiment.
Figure 5:
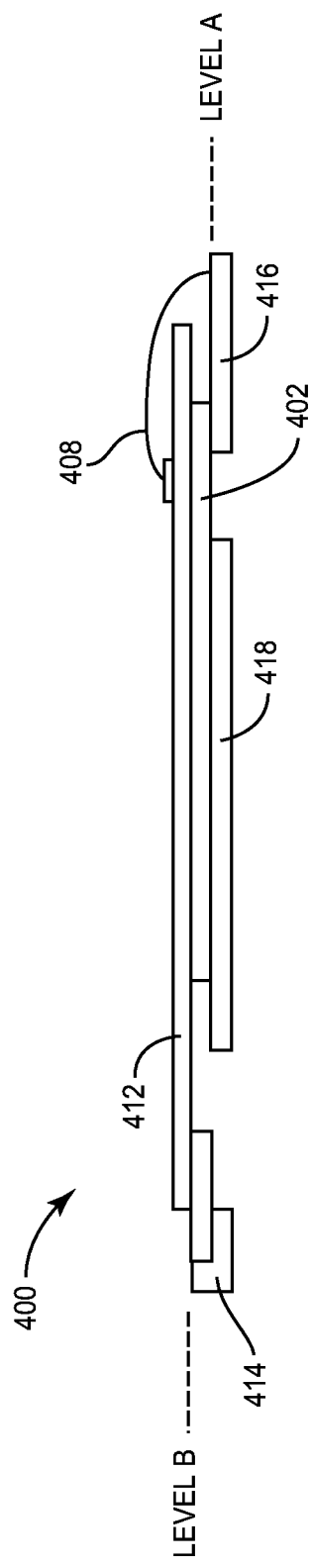
FIG. 5 illustrates a side perspective view of the multi-level semiconductor package of FIG. 4.

FIG. 4 illustrates a top plan view of yet another embodiment of a multi-level semiconductor package 400, and FIG. 5 illustrates a perspective side view of the package 400. Similar to the package shown in FIG. 2, the package 400 shown in FIGS. 4 and 5 includes at least two transistor dies 402, 404 which form a half-bridge converter circuit of the kind shown in FIG. 3 in an exemplary embodiment. Other circuit configurations can be realized depending on the type of dies included in the package 400. The dies 402, 404 included in the package 400 shown in FIGS. 4 and 5 are arranged in the same plane, and are not stacked one above the other, as shown in FIG. 2. In this purely illustrative embodiment, the circuit connections to the dies 402, 404 are the same as previously explained herein with regard to the half-bridge converter circuit of FIG. 3. Only the gate electrode 406 at the top side of the second die 404 is visible in FIG. 4. The gate electrode 406 of the second die 404 is connected by bond wires 408 to a first lead 410 of the package 400 which is electrically connected to the gate input (IN1) of the high-side transistor HS. The first lead 410 terminates at a first level ('level A') in the package 400. A connector 412 of a single continuous planar construction connects the source electrode at the top side of the second die 404 to a second lead 414 at the same level ('level B') in the package 400, and obscures most of the package components in FIG. 4.

The second lead 414 is electrically connected to the output terminal (Vout) of the half-bridge circuit. The drain electrode at the top side of the first die 402 and the source electrode at the top side of the second die 404 are both connected to the planar connector 412. The planar connector 412 extends over both dies 402, 404, and is connected to the drain and source electrodes of both dies 402, 404, respectively, and to the second lead 414 at the same third level (Level B) in the package 400, providing a large-area planar connection between these die electrodes and the second lead 414 of the package 400. In one embodiment, the planar connector 412 has a surface area larger than a combined surface area of both dies 402, 404.

The gate electrode at the bottom side of the first die 402 is connected to a third lead 416 at the first level (Level A) of the package 400. The third lead 416 is electrically connected to the gate input (IN2) of the low-side transistor LS. The source electrode at the bottom side of the first die 402 is connected to a fourth lead 418 which also terminates at the first level (Level A) of the package 400. The fourth lead 418 is electrically connected to the negative input (Vin−) of the half-bridge circuit. A fifth lead 420 under the second die 404 is similarly connected to the drain electrode at the bottom side of the second die 404. The fifth lead 420 is electrically connected to the positive input (Vin+) of the half-bridge circuit. The package 400 can be encapsulated by a mold compound.

The packages described herein can have a standard form-factor such as SO (small outline), SOP (small outline package), SOT (small outline transistor package), SuperSO (manufactured by Infineon Technologies), etc. In general, the packages described herein have the leads at different levels in the package and use connectors of a single continuous planar construction for die electrode-to-lead connections.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor package, comprising:
   a first semiconductor die having a top side and a bottom side;
   a second semiconductor die over the first die and having a top side facing away from the first die and a bottom side facing the top side of the first die;
   an electrode at the top side of the first die connected to an electrode at the bottom side of the second die between the first and second dies;
   a first lead under the first die and connected to an electrode at the bottom side of the first die at a first level of the package;
   a second lead having a height greater than the first lead and terminating at a second level in the package above the first level, the second level corresponding to a height of the second die; and
   a connector of a single continuous planar construction over the second die and the second lead, the connector being connected to both an electrode at the top side of the second die and the second lead at the same second level.

2. The semiconductor package according to claim 1, further comprising:
   a third lead having a height between the first and second leads and terminating at a third level in the package between the first and second levels, the third level corresponding to a height of the first die; and
   an additional connector of a single continuous planar construction extending between the first and second dies to the third lead and connecting the electrode at the top side of the first die and the electrode at the bottom side of the second die to the third lead, the additional connector being connected to both the electrode at the top side of the first die and the third lead at the same third level.

3. The semiconductor package according to claim 1, wherein the first lead has an uncovered first side facing away from the dies and an opposing second side connected to the electrode at the bottom side of the first die via a first joining layer, wherein the second lead has an uncovered first side facing away from the dies and an opposing second side which terminates at the second level, and wherein the connector is connected to both the electrode at the top side of the second die and the second side of the second lead via a second joining layer.

4. The semiconductor package according to claim 3, wherein the joining layers each comprise an electrically conductive solder, adhesive or tape.

5. The semiconductor package according to claim 1, further comprising a third lead having the same height as the first lead and connected to an additional electrode at the bottom side of the first die at the first level of the package.

6. The semiconductor package according to claim 1, wherein:
   the first die is a low-side transistor of a half-bridge converter circuit and the second die is a high-side transistor of the half-bridge converter circuit;
   the electrode at the bottom side of the first die is a source electrode of the low-side transistor;
   the electrode at the top side of the first die is a drain electrode of the low-side transistor;
   the electrode at the top side of the second die is a drain electrode of the high-side transistor;
   the electrode at the bottom side of the second die is a source electrode of the high-side transistor;
   the second lead is designated as an output of the half-bridge converter circuit; and
   the connector connects the second lead to the drain electrode of the low-side transistor and to the source electrode of the high-side transistor at the same second level via a joining layer.

* * * * *